United States Patent
Kim et al.

(10) Patent No.: US 10,446,621 B2
(45) Date of Patent: Oct. 15, 2019

(54) ORGANIC LIGHT EMITTING DISPLAY AND DEGRADATION SENSING METHOD THEREOF

(71) Applicant: LG DISPLAY CO., LTD., Seoul (KR)

(72) Inventors: Changhee Kim, Goyang-si (KR); Hyemin Park, Goyang-si (KR)

(73) Assignee: LG DISPLAY CO., LTD., Seoul (KR)

(*) Notice: Subject to any disclaimer, the term of this patent is extended or adjusted under 35 U.S.C. 154(b) by 97 days.

(21) Appl. No.: 15/685,887

(22) Filed: Aug. 24, 2017

(65) Prior Publication Data

US 2018/0061913 A1 Mar. 1, 2018

(30) Foreign Application Priority Data

Aug. 31, 2016 (KR) .................... 10-2016-0112234

(51) Int. Cl.
*H01L 27/32* (2006.01)
*G09G 3/3225* (2016.01)
*G09G 3/3233* (2016.01)

(52) U.S. Cl.
CPC ....... *H01L 27/3244* (2013.01); *G09G 3/3225* (2013.01); *G09G 3/3233* (2013.01); *G09G 2300/0465* (2013.01); *G09G 2320/0219* (2013.01); *G09G 2320/0295* (2013.01); *G09G 2320/045* (2013.01)

(58) Field of Classification Search
CPC ... G09G 3/30; G09G 3/3028; G09G 2320/045
See application file for complete search history.

(56) References Cited

U.S. PATENT DOCUMENTS

| | | | |
|---|---|---|---|
| 2014/0267215 A1* | 9/2014 | Soni ..................... | G09G 3/3233 345/212 |
| 2015/0009204 A1* | 1/2015 | Chaji ................... | G09G 3/3233 345/214 |
| 2015/0179105 A1* | 6/2015 | Mizukoshi .......... | G09G 3/3266 345/76 |
| 2016/0012798 A1 | 1/2016 | Oh et al. | |
| 2016/0027382 A1* | 1/2016 | Chaji .................... | G09G 3/006 345/212 |
| 2016/0155380 A1 | 6/2016 | Kwon et al. | |

* cited by examiner

*Primary Examiner* — Yuzhen Shen
(74) *Attorney, Agent, or Firm* — Seed IP Law Group LLP

(57) ABSTRACT

A display and degradation sensing method, includes a display panel having a plurality of pixels that each comprise an Organic Light Emitting Diode (OLED) and Thin Film Transistor (TFT). The pixels are divided into multiple pixel groups of two or more pixels, each connected to different data lines but to the same gate and sensing lines. A gate driving circuit supplies a scan control signal to the gate line. A data driving circuit selectively supplies turn-on driving data voltage and turn-off data voltage to the data lines in sync with the scan control signal; a sensing circuit outputs (i) a first sensing value based upon an OLED threshold voltage of a sensing pixel, and (ii) a second sensing value based upon a kickback current. A sensing value correction circuit determines a final sensing value for the OLED threshold voltage based on the first sensing value and the second sensing value.

12 Claims, 14 Drawing Sheets

ORGANIC LIGHT EMITTING DISPLAY AND DEGRADATION SENSING METHOD THEREOF

This application claims the benefit of Korea Patent Application No. 10-2016-0112234 filed on Aug. 31, 2016, which is incorporated herein by reference for all purposes as if fully set forth herein.

TECHNICAL FIELD

The present disclosure relates to an organic light emitting display, and more particularly to an organic light emitting display and a method of sensing degradation of an Organic Light Emitting Diode (OLED) of the same.

BACKGROUND

Description of the Related Art

An active matrix organic light emitting display includes an Organic Light Emitting Diode (hereinafter, abbreviated to "OLED") capable of emitting light by itself, and has advantages of a fast response time, a high light emitting efficiency, high luminance, and a wide viewing angle.

An OLED serving as a self-emitting element includes an anode electrode, a cathode electrode, and an organic compound layer formed between the anode electrode and the cathode electrode. The organic compound layer includes a hole injection layer HIL, a hole transport layer HTL, a light emitting layer EML, an electron transport layer ETL, and an electron injection layer EIL. When a driving voltage is applied to the anode electrode and the cathode electrode, holes passing through the hole transport layer HTL and electrons passing through the electron transport layer ETL move to the light emitting layer EML and form excitons. As a result, the light emitting layer EML generates visible light.

An organic light emitting display includes pixels arranged in a matrix form thereon, each pixel including an OLED, and adjusts luminance of the pixels according to a grayscale level of video data. Each pixel includes a driving Thin Film Transistor (TFT), which controls a driving current flowing in the OLED dependent upon a voltage Vgs applied between a gate electrode and a source electrode of the driving TFT. In addition, each pixel adjusts a gray scale (luminance) based on a light emitting amount of the OLED which is proportional to the driving current.

Degradation characteristics of an OLED are that an operating point voltage (a threshold voltage) of the OLED is increased and a light emitting efficiency thereof is reduced as a light emitting period of time elapses. A degree of degradation of the OLED for a light emitting period may be different from pixel to pixel. A deviation in degradation between pixels causes a deviation in luminance, which could possibly lead to an image sticking phenomenon.

As a way for compensating for poor image quality caused by a deviation of OLED degradation, a compensation method for sensing OLED degradation and modulating digital image data based on a sensing value is known. To enhance confidence of compensation, it is necessary to accurately sense the OLED degradation. Many methods of sensing OLED degradation have been proposed, but they fail to meet expectations in terms of accuracy of sensing.

BRIEF SUMMARY

Accordingly, the present disclosure aims to provide an organic light emitting display designed to enhance accuracy of sensing degradation of an Organic Light Emitting Diode (OLED), and a method of sensing degradation of the OLED.

To achieve the above object, the present disclosure provides an organic light emitting display including: a display panel having a plurality of pixels arranged thereon, wherein each of the pixels comprises an Organic Light Emitting Diode and a driving Thin Film Transistor, and the plurality of pixels are divided into multiple pixel groups, each pixel group including two or more pixels connected to different data lines and to a same gate line and a same sensing line; a gate driving circuit configured to supply a scan control signal to the gate line; a data driving circuit configured to selectively supply a turn-on driving data voltage and a turn-off data voltage to the data lines in sync with the scan control signal; a sensing circuit configured to output a first sensing value based at least in part upon an Organic Light Emitting Diode threshold voltage of a sensing pixel among the two or more pixels in which the first sensing value is dependent upon the turn-on data voltage, and output a second sensing value based at least in part upon a kickback current that is dependent upon the turn-off data voltage; and a sensing value correction circuit configured to calculate a final sensing value for the Organic Light Emitting Diode threshold voltage based on the first sensing value and the second sensing value.

The present disclosure provides a degradation sensing method of an organic light emitting display having a display panel, wherein a plurality of pixels each having an Organic Light Emitting Diode and a driving Thin Film Transistor is arranged on the display panel and the plurality of pixels are divided into multiple pixel groups, each pixel group including two or more pixels connected to different data lines and to a same gate line and a same sensing line, and wherein the method comprises: supplying a scan control signal to the gate line; selectively supplying an turn-on data voltage and an turn-off data voltage to the data lines in sync with the scan control signal; outputting a first sensing value based at least in part upon an Organic Light Emitting Diode threshold voltage of a sensing pixel among the two or more pixels in which the first sensing value is dependent upon the turn-on data voltage, and sensing a second sensing value based at least in part upon a kickback current that is dependent upon the turn-off data voltage; and calculating a final sensing value for the Organic Light Emitting Diode threshold voltage based on the first sensing value and the second sensing value.

BRIEF DESCRIPTION OF THE SEVERAL VIEWS OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Figure 1:
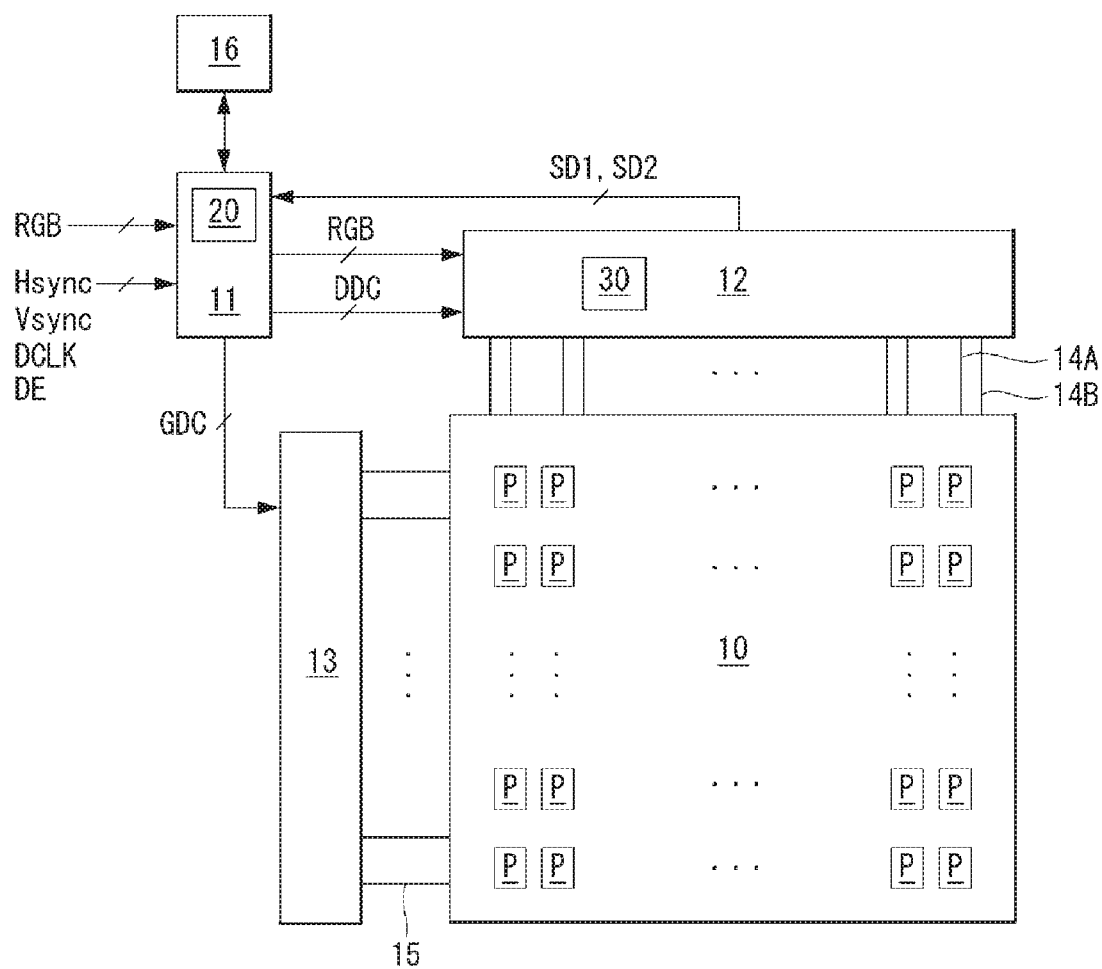
FIG. 1 is a block diagram illustrating an organic light emitting display according to an embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where "comprise", "have", and "include" described in the present specification are used, another part may be added unless "only" is used. The terms of a singular form may include plural forms unless referred to the contrary.

In construing an element, the element is construed as including an error range although there is no explicit description.

In description of embodiments of the present disclosure, when a relationship of two elements is described using "on~", "above~", "below~", "next~", etc., this description should be construed as one or more elements can be positioned between the two elements unless "directly" is used.

In description of embodiments of the present disclosure, when an element or layer is "on" a different element or layer, this description should be construed in that another layer or element is on the different element or positioned between the two elements.

It will be understood that, although the terms "first", "second", etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

The same reference numerals denote the same elements throughout the specification.

The size and thickness of each element in the drawings are illustrated by way of example, and aspects of the present disclosure are not limited thereto.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, various embodiments of the present disclosure will be described in detail with reference to the accompanying drawings.

Figure 2:
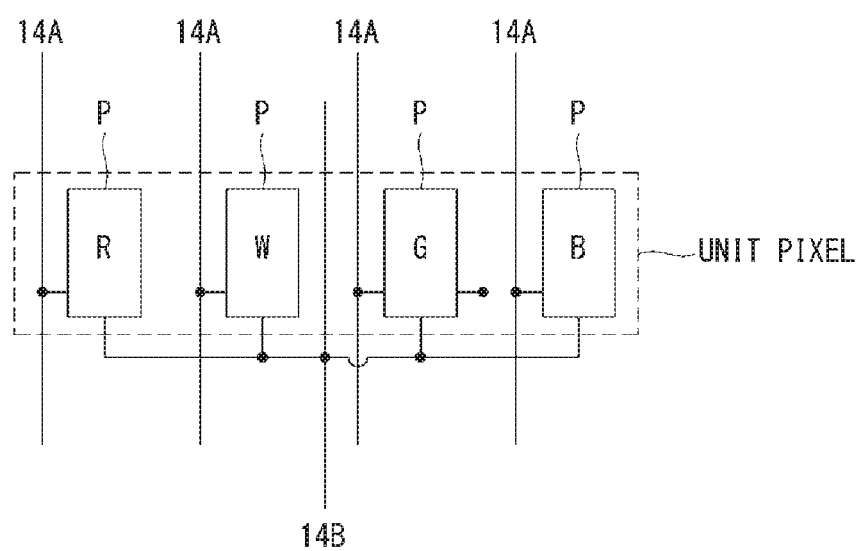
FIG. 2 is a circuit diagram illustrating an exemplary coupling of a sensing line and a pixel.
Figure 3:
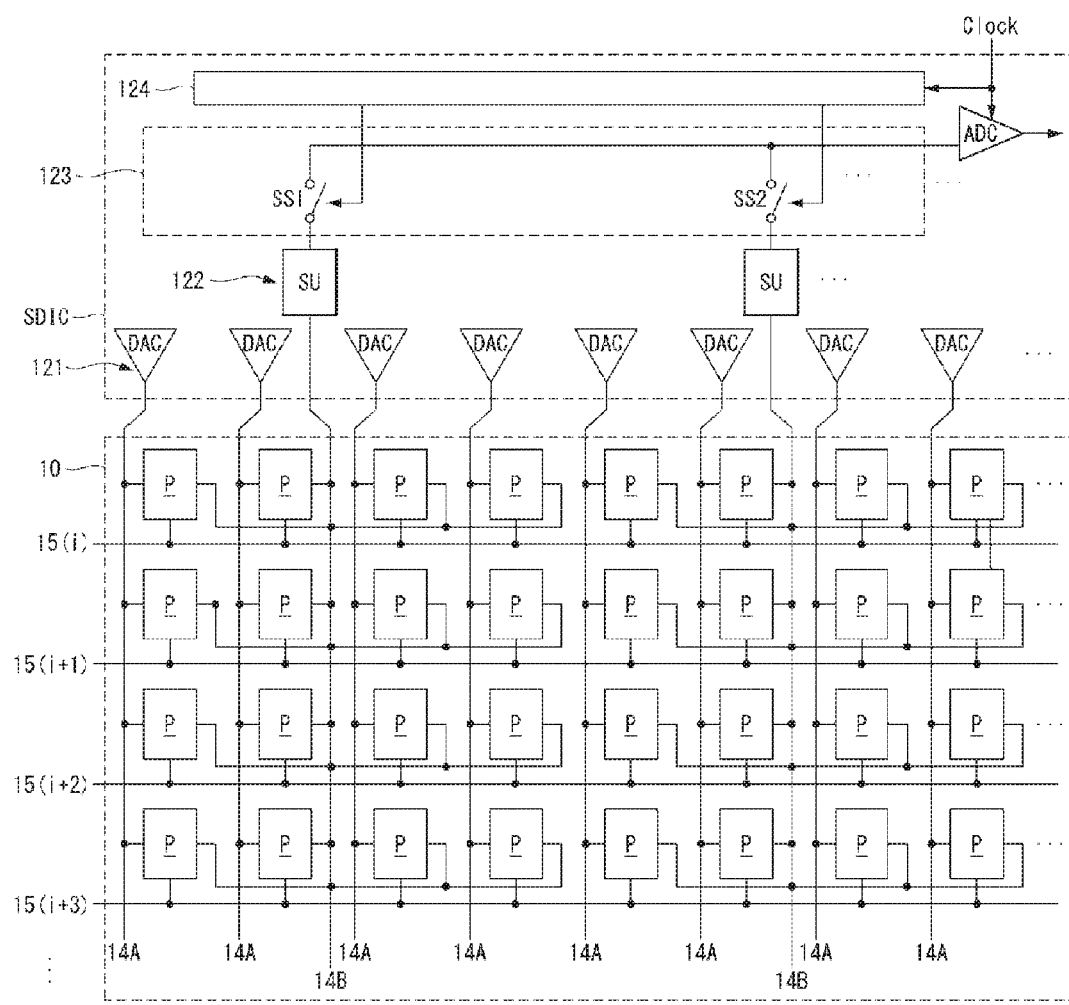
FIG. 3 is a circuit diagram illustrating an exemplary configuration of a pixel array and a data driver Integrated Circuit (IC)

FIG. 1 is a block diagram illustrating an organic light emitting display according to an embodiment of the present disclosure. FIG. 2 is a diagram illustrating an exemplary coupling of a sensing line and a pixel. FIG. 3 is a diagram illustrating an exemplary configuration of a pixel array and a data driver Integrated Circuit (IC).

Referring to FIGS. 1 to 3, an organic light emitting display according to an embodiment of the present disclosure may include a display panel 10, a timing controller 11, a data driving circuit 12, a gate driving circuit 13, a memory 16, a sensing value correction circuit 20, and a sensing circuit 30.

A plurality of data lines 14A, a plurality of sensing lines 14B, and a plurality of gate lines 15 may intersect one another on the display panel 10, and pixels P are arranged in matrix form at one or more, and potentially at each, of the intersections.

Two or more pixels P may be electrically coupled to different data lines 14A but may be electrically coupled to the same sensing line and the same gate line. The two or more pixels P may form a pixel group. For example, as shown in FIG. 2, a red (R) pixel, a white (W) pixel, a green (G) pixel, and a blue (B) pixel which horizontally neighbor one another to be connected to the same gate line may be connected to one sensing line 14B. This structure in which pixels in a row share one sensing line may advantageously be used to secure an aperture ratio of a display panel. In this sensing line structure, one sensing line 14B may be arranged for a plurality of data lines 14A. In the exemplary embodiments shown in FIGS. 1 to 3, the sensing line 14B is depicted as being in parallel to the data lines 14A, but in other embodiments, the sensing line 14B may be arranged to intersect the data lines 14A.

An R pixel, a G pixel, and a B pixel may constitute one unit pixel. However, a unit pixel may consist of an R pixel, a G pixel, a B pixel, and a W pixel.

Each pixel P may be supplied from a non-illustrated power generation unit with a high potential driving voltage EVDD and a low potential driving voltage EVSS. A pixel P of the present disclosure may have a circuit structure suitable for sensing degradation of an Organic Light Emitting Diode (OLED) over time. Various modifications can be made to the circuit of the pixel P and be within the scope of the present disclosure. For example, apart from an OLED and a driving TFT DT, a pixel may include at least two switch TFTs and at least one storage capacitor. TFTs composing a pixel P may be implemented in the form of P type, a N type, or a hybrid type which is a mixture of the P type and the N type. In addition, semiconductor layers of TFTs composing a pixel P may include amorphous silicon, polysilicon, or oxide.

The timing controller 11 may temporally separate a sensing operation and a displaying operation according to a predetermined control sequence. The sensing operation is an operation for sensing degradation of the OLED and updating a compensation value therefor. The displaying operation is an operation for displaying an input image by applying the compensation value. Under control of the timing controller 11, the sensing operation may be performed at various times, such as, for example, in a vertical blank period during image displaying, in a power-on sequence period before image displaying, or in a power-off sequence period after image displaying. The vertical blank period, a period during which image data is not written, is disposed between vertical active sections in which image data of one frame is written. The power ON sequence period refers to a period from a point in time at which driving power is turned on to a point in time at which an image is displayed. The power OFF sequence period refers to a period from a point in time at which image displaying is finished to a point in time at which driving power is turned off.

The sensing operation may be performed when the screen of a display device is turned off while system power is still being applied, for example, an idle mode, a sleep mode, a low power mode, etc. The timing controller 11 may sense the idle mode, the sleep mode, the low power mode, etc., in a predetermined sensing process, and control relevant operations for the sensing operation.

The timing controller 11 may generate a data control signal DDC for controlling an operation timing of the data driving circuit 12 and a gate control signal GDC for controlling an operation timing of the gate driving circuit 13 on the basis of timing signals received from a host system, such as a vertical synchronization signal Vsync, a horizontal synchronization signal Hsync, a dot clock signal DCLK, and a data enable signal DE. The timing controller 11 may generate different control signals DDC and GDC for external compensation.

The gate control signal GDC includes a gate start pulse, a gate shift clock, and the like. The gate start pulse is applied to a gate stage, from which a first output is generated, so that the gate start pulse is used to control the gate stage. The gate shift clock is a clock signal that is input to all gate stages, so that the gate shift clock is used to shift a gate start pulse.

The data control signal DDC includes a source start pulse, a source sampling clock, a source output enable signal, and the like. The source start pulse controls a data sampling start timing of the data driving circuit 12. The source sampling clock is a clock signal for controlling a sampling timing of data in each of the source drive ICs with respect to a rising or falling edge. The source output enable signal controls an output timing of the data driving circuit 12.

In the sensing operation, the timing controller 11 may store a compensation value, calculated in a compensation circuit, in the memory 16. The compensation value stored in the memory 16 may be updated each time for updating, and accordingly it is possible to easily compensate for an OLED property deviation. In a displaying operation, the timing controller 11 may supply a compensation value, retrieved from the memory 16, to the compensation circuit. The compensation circuit may correct digital data DATA of an input image based on the compensation value, and supply the corrected digital data DATA to the data driving circuit 12. The compensation circuit may be embedded in the timing controller 11.

The data driving circuit 12 includes at least one source driver IC SDIC. The source driver IC SDIC may include a plurality of digital-to-analog converters (DACs) 121 respectively connected to the data lines 14A. During the displaying operation, the DACs may convert the digital video data RGB input from the timing controller 11 into a data voltage for displaying an image in response to a data timing control signal DDC received from the timing controller 11, and supply the converted data voltage to the data lines 14A. Meanwhile, during the sensing operation, the DACs of the data driver IC SDIC may generate a data voltage in response to a data timing control signal DDC received from the timing controller 11, and supply the data voltage to the data lines 14A.

The generated data voltage includes a turn-on data voltage and a turn-off data voltage. The turn-on data voltage is a voltage applied to a gate electrode of the driving TFT to turn on the driving TFT. The turn-off data voltage is a voltage applied to the gate electrode of the driving TFT to turn off the driving TFT.

The turn-on data voltage is applied only to a sensing pixel, which is a target to be sensed, while the turn-off data voltage is applied to a non-sensing pixel which shares a sensing line with the sensing pixel. The turn-off data voltage may be applied to the sensing pixel only for a predetermined period of time (for example, a sensing period).

The data driver IC SDIC may include a sensing circuit 30 mounted thereon. The sensing circuit 30 may include a plurality of sensing units SU 122 connected to the sensing lines 14B, a MUX 123 selectively connecting the sensing units SU 122 to an Analog-Digital Converter ADC, and a shift register 124 configured to generate a selection control signal to turn on switches SS1 to SSk of the MUX 123 sequentially. Each sensing unit SU 122 may be implemented as a current integrator or a current-to-voltage converter such as a current comparator. Since employing a current sensing method, each sensing unit SU 122 implements low-current and high-speed sensing, and is thereby enabled to reduce sensing time and enhance sensing sensitivity. The ADC may convert a sensing voltage, which is received from the MUX 123, into a sensing value SD and output the sensing value SD to the sensing value correction circuit 20.

The sensing circuit 30 is connected to the sensing line 14B. The sensing circuit 30 outputs a first sensing value SD1 to the sensing value correction circuit 20 by primarily sensing an OLED threshold voltage (that is, an amount of charges stored in a parasitic capacitor of the OLED) dependent upon the turn-on data voltage, and outputs a second sensing value SD2 to the sensing value correction circuit 20 by secondarily sensing a kickback current dependent upon the turn-off data voltage.

The sensing value correction circuit 20 calculates a final sensing value for the OLED threshold voltage based on the first sensing value SD1 and the second sensing value SD2. The final sensing value does not include a kickback current component, and thus, the accuracy of sensing may improve. The sensing value correction circuit 20 may be embedded in the timing controller 11, but aspects of the present disclosure are not limited thereto.

In the sensing operation, the gate driving circuit 13 may generate a scan control signal based on a gate control signal GDC, and supply the scan control signal to gate lines 15(i) to 15(i+3). In the displaying operation, the gate driving circuit 13 may generate a scan control signal based on a gate control signal GDC, and supply the scan control signal to the gate lines 15(i) to 15(i+3).

Figure 4:
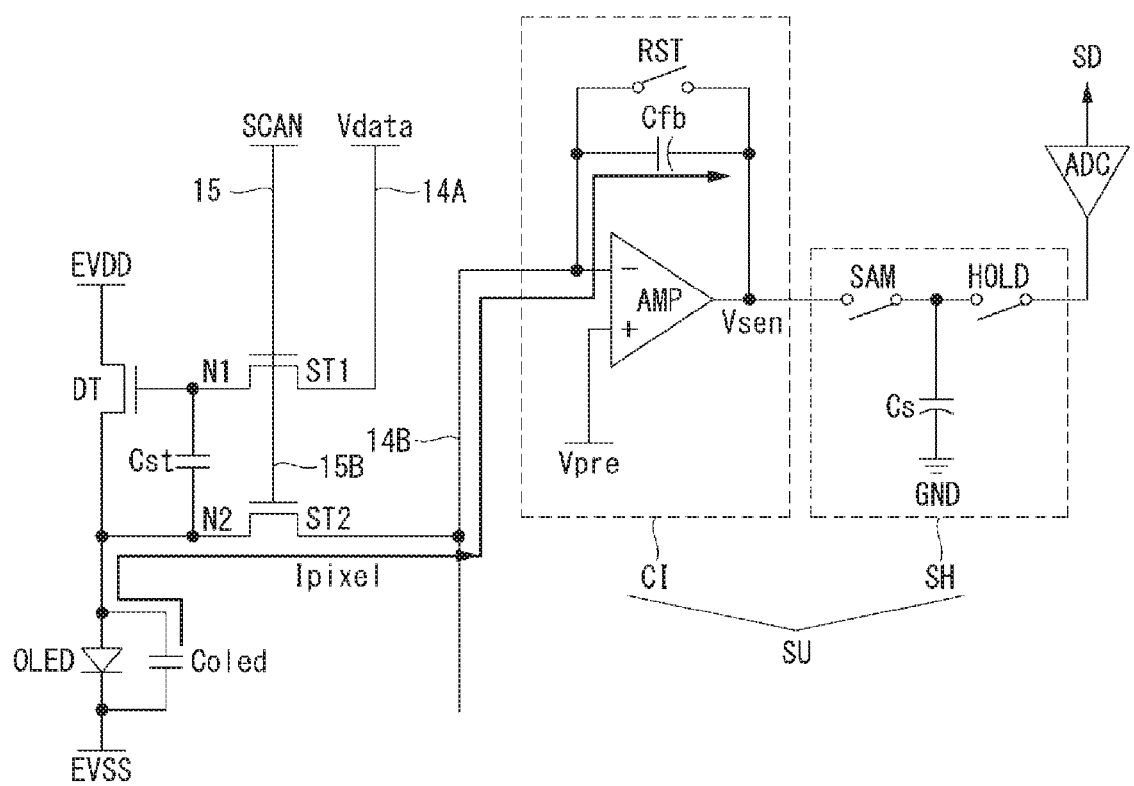
FIG. 4 is a circuit diagram illustrating an exemplary configuration of a pixel and a sensing unit according to the present disclosure.

FIG. 4 is a diagram illustrating an exemplary configuration of a pixel and a sensing unit according to the present disclosure. FIG. 4 is merely exemplary, and the technical idea of the present disclosure is not limited to the exemplary structure of the pixel P and the sensing unit 122.

Referring to FIG. 4, each pixel P may include an OLED, a driving TFT DT, a storage capacitor Cst, a first switch TFT ST1, and a second switch TFT ST2.

The OLED includes an anode electrode connected to a source node N2, a cathode electrode connected to an input terminal of the low potential driving voltage EVSS, and an organic compound layer positioned between the anode electrode and the cathode electrode. A parasitic capacitor Coled is generated in the OLED by the anode electrode, the cathode electrode, and a plurality of insulating layers positioned between the anode electrode and the cathode electrode. The number of capacitances of the OLED parasitic capacitor Coled is on the order of pF, which is very small as compared with hundreds to thousands of parasitic capacitances existing in a sensing line 14B. The present disclosure utilizes the OLED parasitic capacitor Coled to sense a current.

The driving TFT DT controls a driving current that is input to the OLED according to a gate-source voltage Vgs. The driving TFT DT includes a gate electrode connected to a gate node N1, a drain electrode connected to an input terminal of the high potential driving voltage EVDD, and a source electrode connected to a source node N2. The storage capacitor Cst is connected between the gate node N1 and the source node N2. The first switch TFT ST1 applies a data voltage Vdata of a data line 14A to the gate node N1 in response to a scan control signal SCAN. The data voltage Vdata includes a turn-on data voltage and a turn-off data voltage. The first switch TFT ST1 includes a gate electrode connected to a gate line 15, a drain electrode connected to a data line 14A, and a source electrode connected to the gate node N1. The second switch TFT ST2 switches a current flow between the source node N2 and the sensing line 14B in response to a scan control signal SCAN. The second switch TFT ST2 includes a gate electrode connected to the gate line 15B, a drain electrode connected to the sensing line 14B, and a source electrode connected to the source node N2.

A sensing unit SU connected to the pixel P through the sensing line 14B may include a current integrator CI and a sample & hold circuit SH.

The current integrator CI generates a sensing voltage Vsen by integrating current information received from the sensing pixel P. The current integrator CI includes an AMP, an integration capacitor Cfb, and a reset switch RST. The AMP includes: an inverting input terminal (−) for applying an initialization voltage Vpre to the source node N2 through the sensing line 14B and receiving the current information Ipixel of a sensed pixel, which is the amount of charges stored in the OLED parasitic capacitor Coled of the pixel P, through the sensing line 14B; a non-inverting input terminal (+) for receiving the initialization voltage Vpre; and an output terminal. The integration capacitor Cfb is connected between the inverting input terminal (−) and the output terminal of the AMP. The reset switch RST is connected to both ends of the integration capacitor Cfb.

The current integrator CI is connected to the ADC through the sample & hold circuit SH. The sample & hold circuit SH includes: a sampling switch SAM configured to sample a sensing voltage Vsen output from the AMP and store the sensing voltage Vsen in the sampling capacitor Cs; and a holding switch HOLD configured to transfer the sensing voltage Vsen stored in the sampling capacitor Cs to the ADC.

Based on the aforementioned exemplary configuration of an organic light emitting display, a degradation sensing method of an organic light emitting display according to an embodiment of the present disclosure will be hereinafter described in detail.

Figure 5:
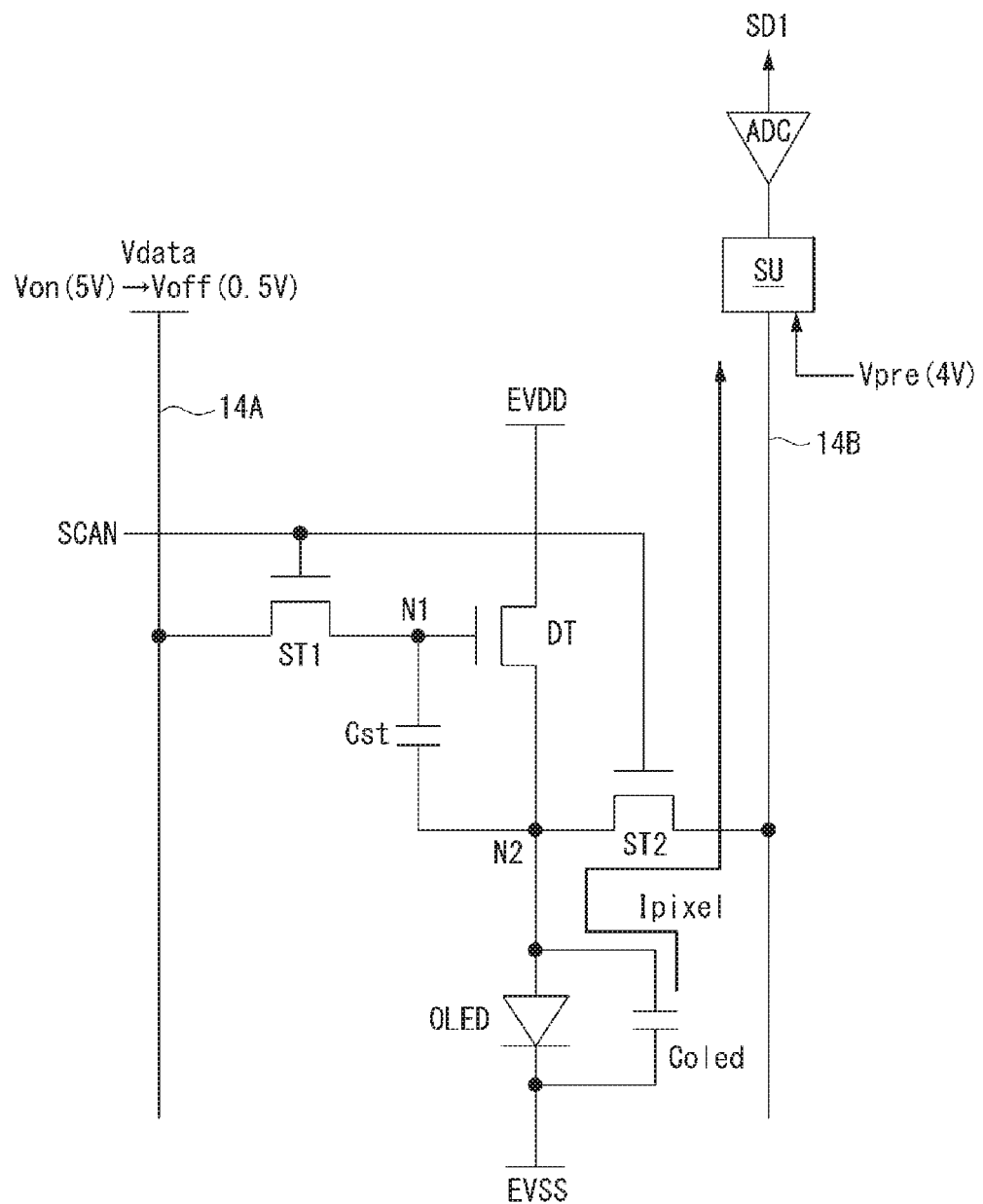
FIG. 5 is a circuit diagram showing the pixel and sensing unit of FIG. 4 during sensing degradation.
Figure 6:
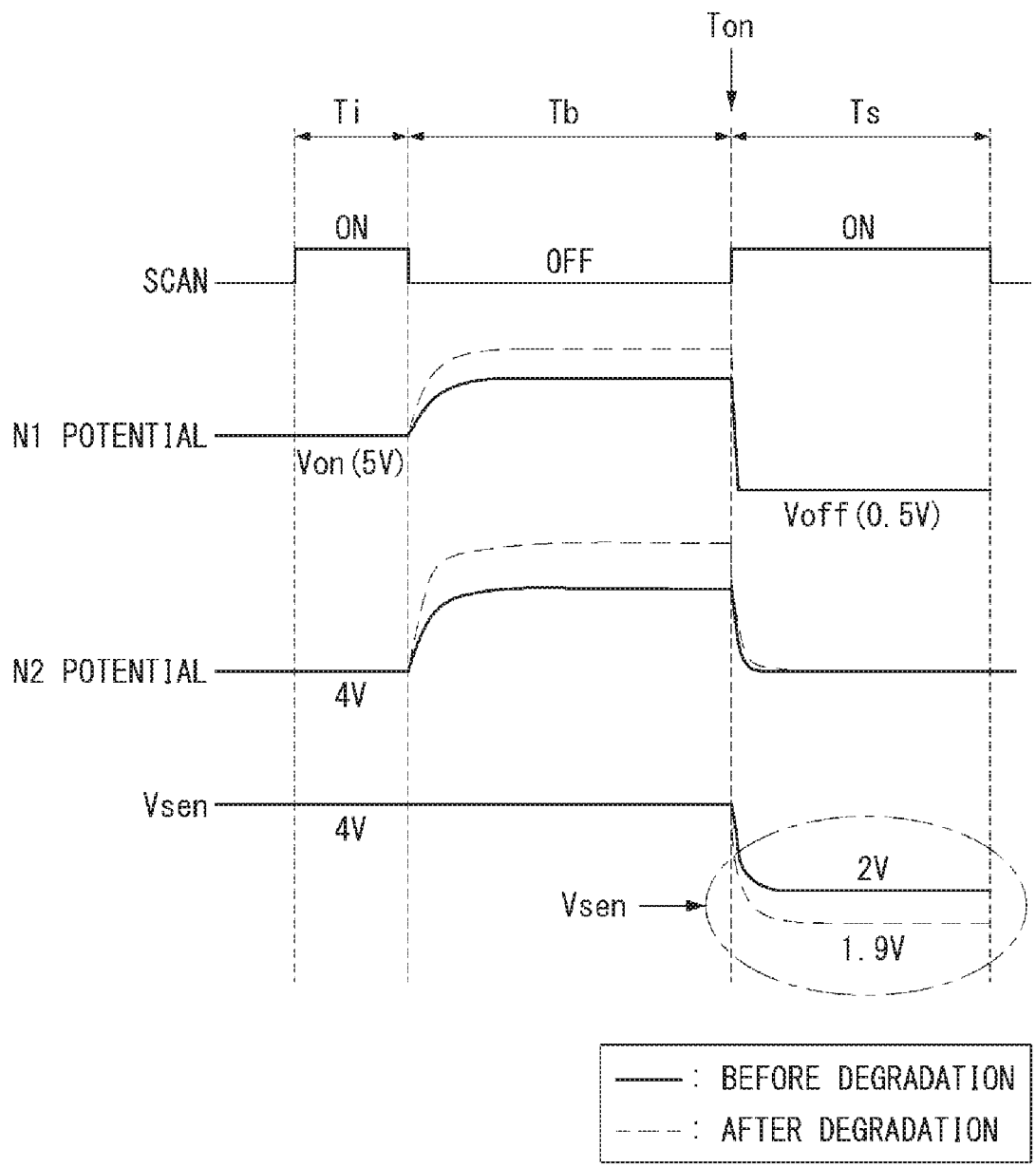
FIG. 6 is a timing diagram showing the operation of the circuit of FIG. 5.

FIGS. 5 and 6 are diagrams for explanation of how a pixel and a sensing unit shown in FIG. 4 operate when sensing degradation.

Referring to FIGS. 5 and 6, an OLED degradation sensing process of the present disclosure may include an initialization period Ti, a boosting period Tb, and a sensing period Ts.

In the initialization period Ti, an integration AMP acts as a unit gain buffer having a gain of 1, whereby the input terminals (+, −) and the output terminals of the integration AMP and the sensing line 14B are all initialized to a reference voltage Vpre.

In the initialization period Ti, a turn-on data voltage Von is applied to the data line 14A. A scan control signal SCAN is applied at an ON level, whereby the first switch TFT ST1 and the second switch TFT ST2 are turned on. In the initialization period Ti, the first switch TFT ST1 is turned on to apply the turn-on data voltage Von (5V) of the data line 14A to the gate node N1. Then, the second switch TFT ST2 is turned on to apply the reference voltage Vpre of the sensing line 14B to the source node N2. As a result, a gate-source voltage of the driving TFT DT may be set to enable a driving current to flow.

In the boosting period Tb, the first and second switch TFTs ST1 and ST2 are turned off in response to a scan control signal of OFF level. At this point, due to a driving current flowing between a source electrode and a drain electrode of the driving TFT DT, the potential of the source node N2, that is, the anode potential of the OLED, is increased to a threshold voltage of the OLED and then saturated. After the boosting, the anode voltage of the OLED is increased in proportion to degradation of the OLED, and therefore, the amount of charges charged in the OLED parasitic capacitor Coled is increased in proportion to the degradation of the OLED (Q=Coled*Vanode). Meanwhile, since the integration AMP continuously acts as a unit gain buffer during the boosting period Tb, the sensing voltage Vsen is maintained at the reference voltage Vpre during the boosting period Tb.

In the sensing period Ts, in response to the scan control signal of ON level, the first and second switch TFTs ST1 and ST2 are turned on and the reset switch RST is turned off. At this point, a turn-off data voltage Voff (0.5V) is applied to the data line 14A. The driving TFT DT is turned off in response to the turn-off data voltage Voff (0.5V) applied through the first switch TFT ST1, thereby preventing that a sensing value is distorted by a current flowing in the driving TFT DT. Sensing is performed in the sensing period TS in a manner where charges stored in the OLED parasitic capacitor Coled become stored in the integration capacitor Cfb of the current integrator CI when the potential of the source node N2 falls from a boosting level to an initialization voltage Vpre (4V). If a period of sensing time becomes longer, the difference in potential of both ends of the integration capacitor Cfb will increase due to charges flowing into the inverting input terminal (−) of the integration AMP during the sensing period Ts. However, a short circuit between the inverting input terminal (−) and the non-inverting input terminal (+)

occurs at a virtual ground due to characteristics of an AMP, so a difference in potential between the inverting input terminal (−) and the non-inverting input terminal (+) is 0. Thus, the potential of the inverting input terminal (−) in the sensing period Ts is maintained at the reference voltage Vpre, regardless of an increase in the potential of the integration capacitor Cfb. Instead, the potential of the output terminal of the AMP is reduced to correspond to a difference in potential of both ends of the integration capacitor Cfb. In this principle, charges flowing through the sensing line 14B in the sensing period Ts is changed into a sensing voltage Vsen, which is an integration value, through the integration capacitor Cfb. In this case, the sensing voltage Vsen may be smaller than the reference voltage Vpre. It is because of inputting and outputting characteristics of the current integrator CI. A difference in potential between the reference voltage Vpre and the sensing voltage Vsen increases if a difference in potential with respect to an initialization voltage Vpre (4V) at a boosting level becomes greater, that is, if degradation becomes worse.

The sensing voltage Vsen bypasses a sampling switch SAM and is then stored in the sampling capacitor Cs. When the holding switch HOLD is turned on, the sensing voltage Vsen stored in the sampling capacitor Cs bypasses the holding switch HOLD and is then input to the ADC. In the ADC, the sensing voltage Vsen is converted into the sensing value SD1.

Figure 7:
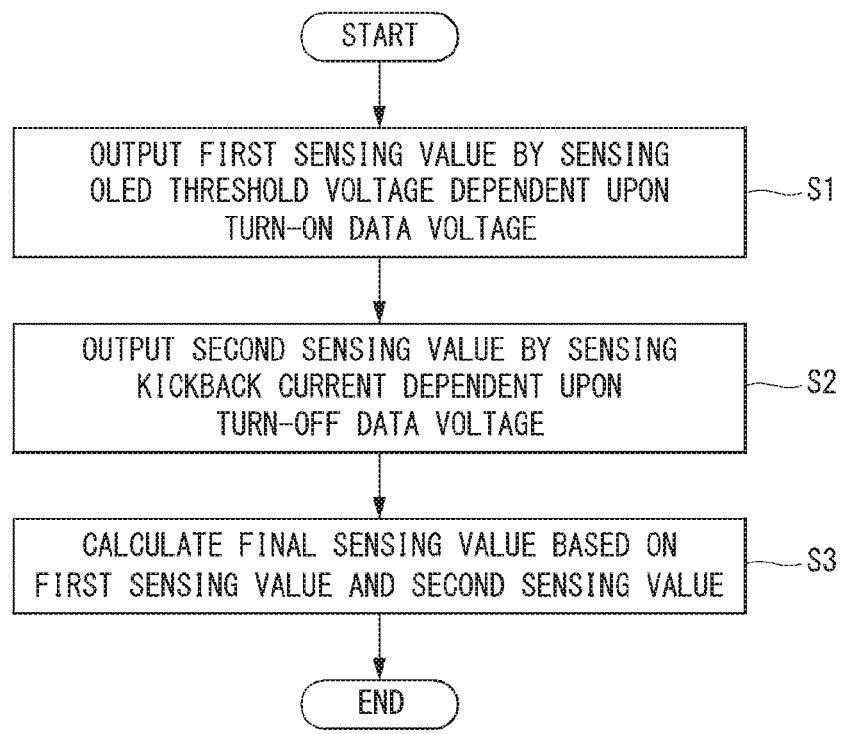
FIG. 7 is a flowchart illustrating a degradation sensing method of an organic light emitting display according to the present disclosure.
Figure 8:
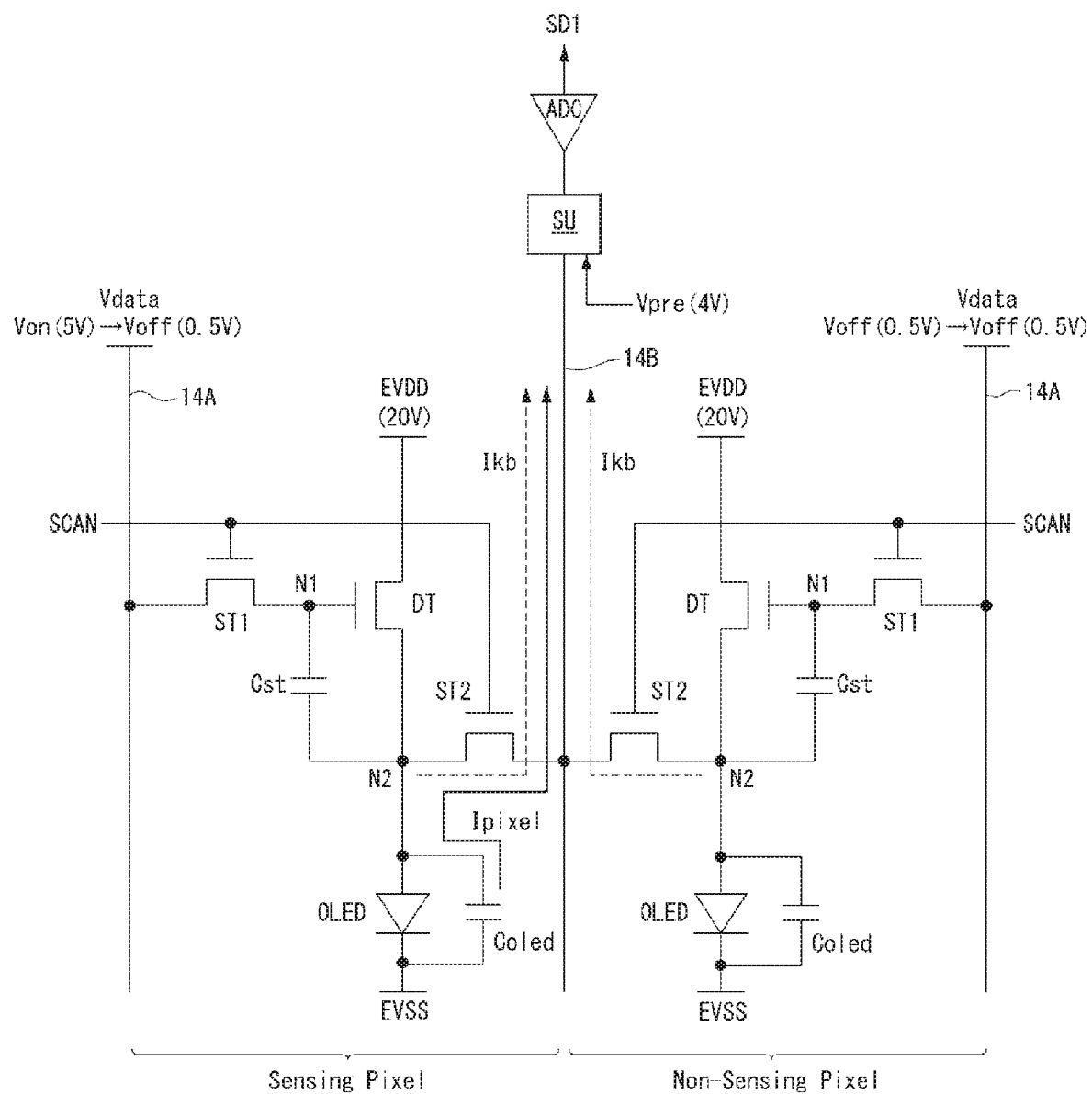
FIG. 8 is a circuit diagram for explanation of operation of a sensing pixel and a non-sensing pixel in step S1 of FIG. 7.
Figure 9:
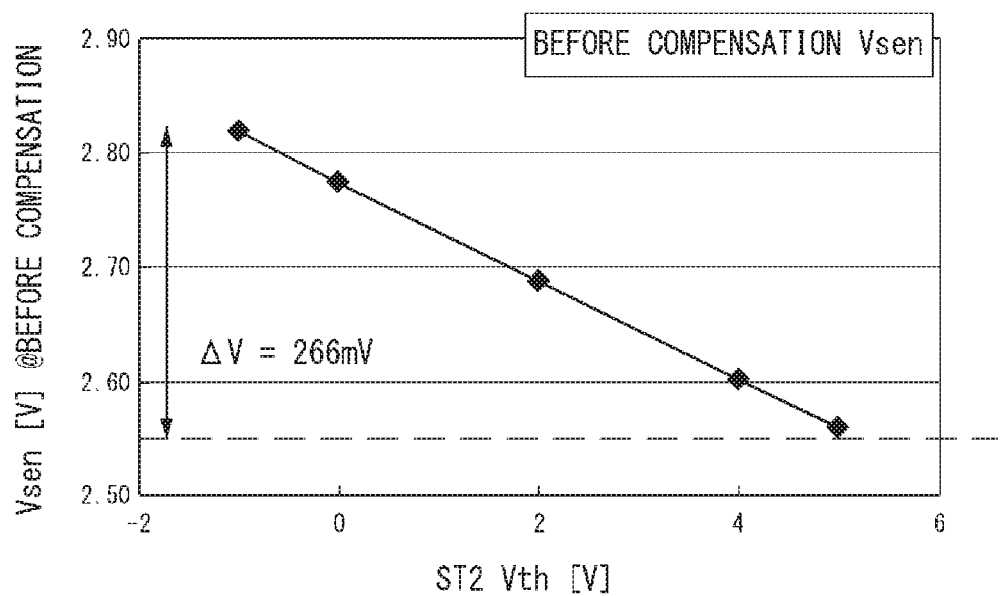
FIG. 9 is a graph showing a sensing voltage detected in step S1 of FIG. 7.
Figure 10:
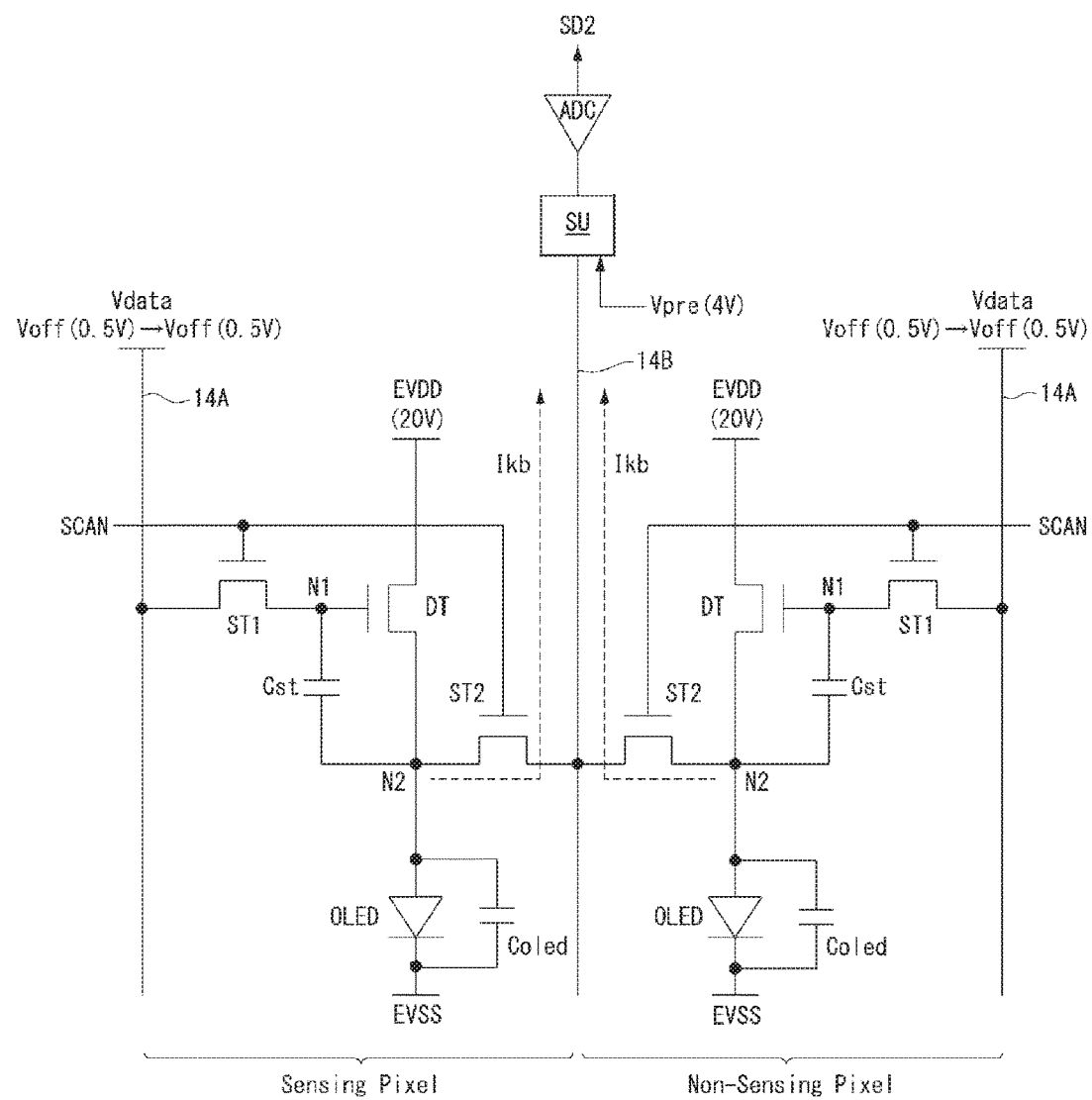
FIG. 10 is a circuit diagram showing a sensing pixel and a non-sensing pixel in step S2 of FIG. 7.
Figure 11:
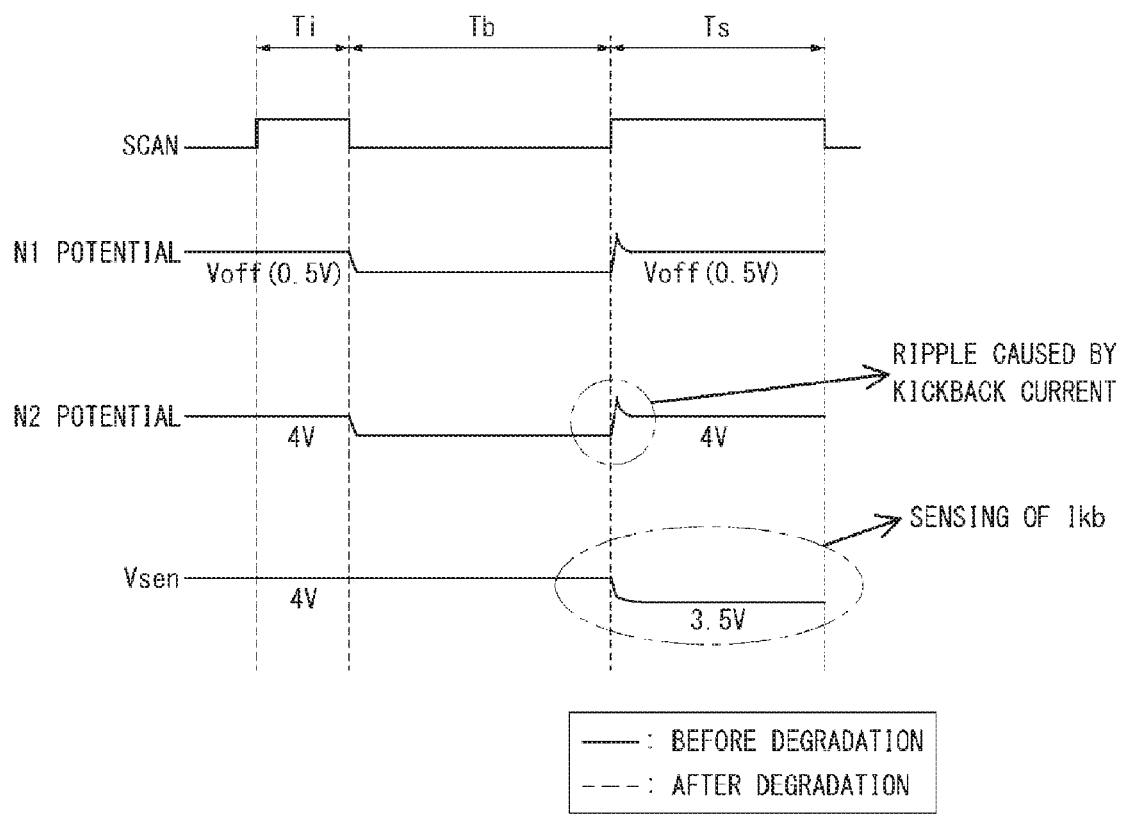
FIG. 11 is a timing diagram showing the operation of the circuit of FIG. 10.
Figure 12:
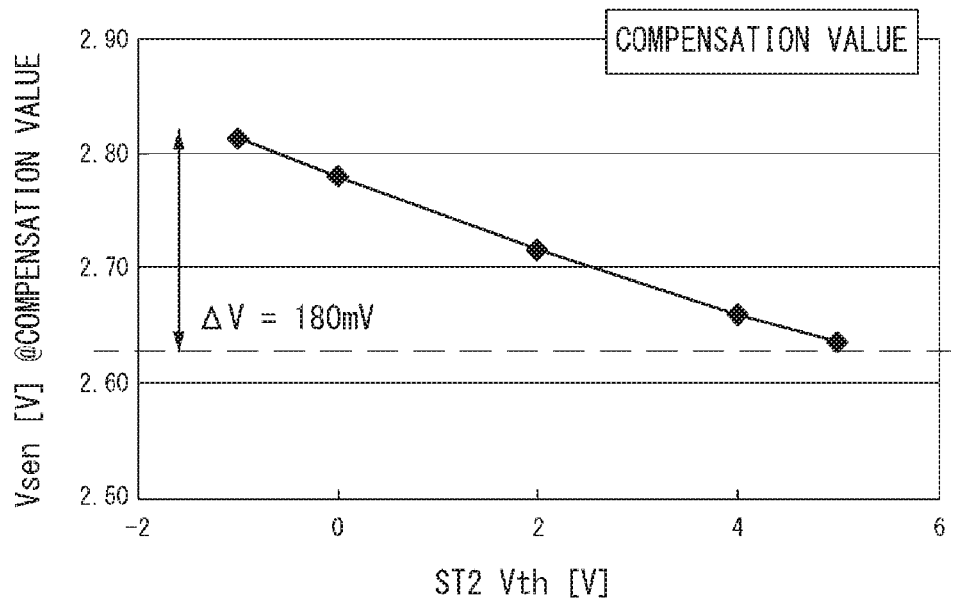
FIG. 12 is a graph showing a sensing voltage detected in step S2 of FIG. 7.
Figure 13:
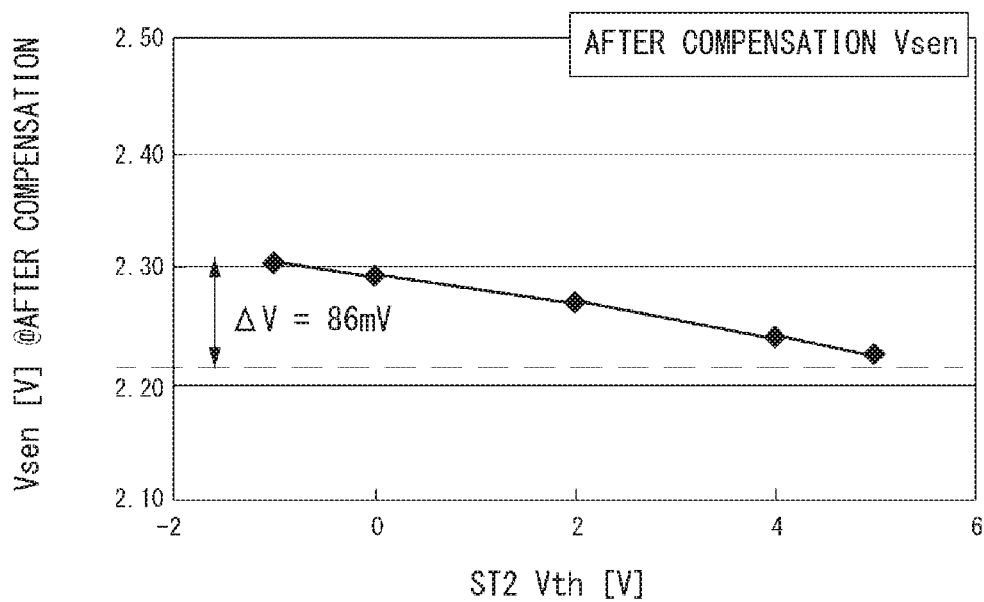
FIG. 13 is a graph showing a sensing voltage calculated in step S3 of FIG. 7.

FIG. 7 is a flowchart illustrating a degradation sensing method of an organic light emitting display according to the present disclosure. FIG. 8 is a diagram for explanation of operation of a sensing pixel and a non-sensing pixel in Step S1 of FIG. 7. FIG. 9 is a graph showing a sensing voltage detected in Step S1 of FIG. 7. FIGS. 10 and 11 are diagrams for explanation of operation of a sensing pixel and a non-sensing pixel in Step S2 of FIG. 7. FIG. 12 is a graph showing a sensing voltage detected in Step S2 of FIG. 7. FIG. 13 is a graph showing a sensing voltage calculated in Step S3 of FIG. 8.

A pixel and a signal necessary for the degradation sensing method of the present disclosure are configured such that, when at least two pixels are connected to different data lines and connected to the same gate line and the same sensing line 14B, as shown in FIGS. 8 and 10, a scan control signal SCAN is supplied to the gate line, a turn-on driving voltage Von (5V) or a turn-off driving voltage Voff (0.5V) is selectively applied to the data lines 14A in sync with the scan control signal SCAN.

In the case where the pixel and the signal are configured as above, the degradation sensing method of an organic light emitting display according to the present disclosure is carried out by outputting a first sensing value SD by primarily sensing an OLED threshold voltage of a sensing pixel dependent upon the turn-on driving voltage Von (5V) in step S1, as shown in FIGS. 7 and 8.

To this end, when the primary sensing is performed, a data driving circuit supplies the turn-on data voltage Von (5V) and the turn-off data voltage Voff (0.5V), alternatively, to the data line 14A connected to the sensing pixel, as shown in FIG. 8 (see the description of FIGS. 5 and 6). Meanwhile, when the primary sensing is performed, the data driving circuit continuously supplies the turn-off data voltage Voff (0.5V) to a data line connected to a non-sensing pixel.

A kickback current Ikb affecting the first sensing value SD1 occurs at a time when the second switch TFT ST2 connected between the source node N2 of the driving TFT DT and the sensing line 14B is turned on (indicated as Ton in FIG. 6). Since a kickback effect of the coupling is changed by a threshold voltage Vth and mobility of the second switch TFT ST2, the kickback current Ikb affecting the first sensing value SD1 may depend on electrical properties of the second switch TFT ST2. Thus, as shown in FIG. 9, the first sensing value SD1, that is, a first sensing voltage Vsen, has a deviation as much as 266 mV due to the kickback current Ikb dependent upon the electrical properties of the second switch TFT ST2. The first sensing value SD1 reflects an OLED threshold voltage of the sensing pixel, the kickback current Ikb of the sensing pixel, and a kickback current Ikb of a non-sensing pixel except for the sensing pixel among the pixels.

Then, a kickback current dependent upon the turn-off data voltage Voff (0.5V) is sensed and a second sensing value SD2 is output in step S2.

To this end, as shown in FIG. 10, the data driving circuit continuously supplies the turn-off data voltage Voff (0.5V) to the data line 14A connected to all pixels including non-sensing pixels and sensing pixels when the secondary sensing is performed.

The kickback current Ikb affecting the second sensing value SD2 occurs at a time when the second switch TFT ST2 connected between the source node N2 of the driving TFT DT and the sensing line 14B is turned on (indicated as Ton in FIG. 6, and a boundary point between Tb and Ts in FIG. 11). As shown in FIG. 11, a ripple is created in the potential waveform of the source node N2 due to the kickback current Ikb. The second sensing voltage Vsen affected only by the kickback current Ikb may have a difference from the initialization voltage (4V), and a value of this difference is detected as the second sensing value SD2.

Since the kickback effect of the coupling is changed by the threshold voltage Vth and mobility of the second switch TFT ST2, the kickback current Ikb affecting the second sensing value SD2 may depend on electrical properties of the second switch TFT ST2. Thus, as shown in FIG. 12, the second sensing value SD2, that is, the second sensing voltage Vsen, has a deviation as much as 180 mV due to the kickback current Ikb dependent upon the electrical properties of the second switch TFT ST2. The second sensing value SD2 reflects a kickback current Ikb of the sensing pixel, and a kickback current Ikb of a non-sensing pixel.

Then, a final sensing value for the OLED threshold voltage is calculated based on the first sensing value SD1 and the second sensing value SD2 in step S3. Step S3 is a step for subtracting the second sensing value SD2 from the first sensing value SD1. Theoretically, the final sensing value should reflect only an OLED threshold value of a sensing pixel with a kickback current removed therefrom. However, the kickback current Ikb is not completely removed, so a small portion thereof remains in the final sensing value. This small portion of the kickback current Ikb is reduced greatly to 80 mV after correction, as shown in the simulation result of FIG. 13.

Figure 14:
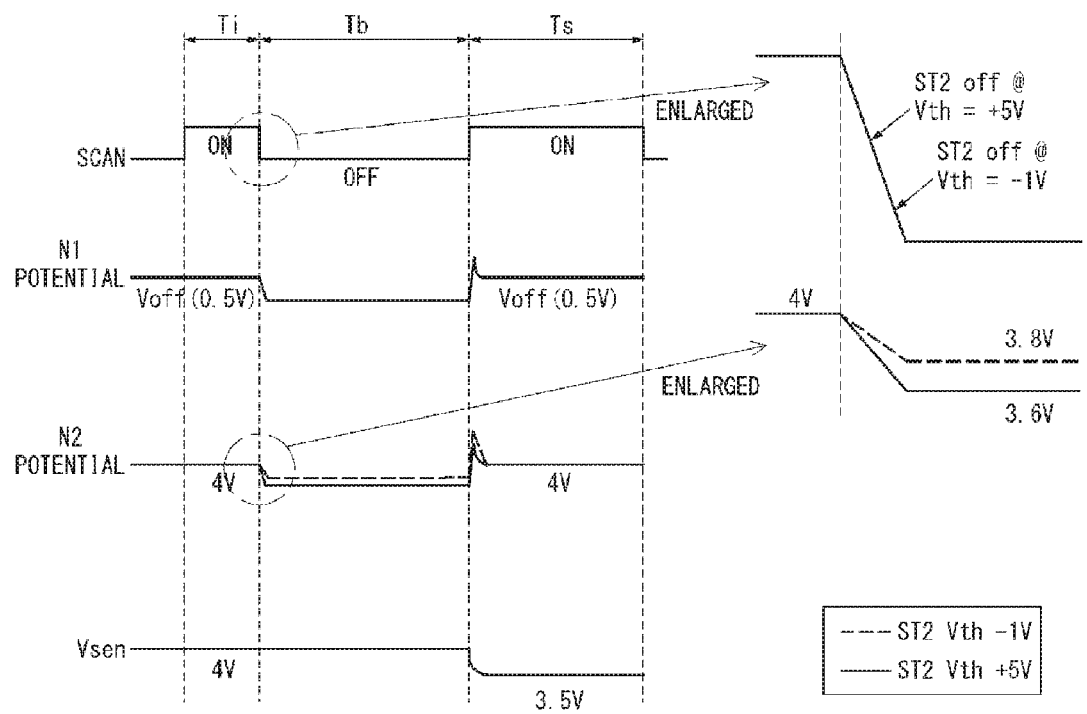
FIG. 14 is a timing diagram showing the potential of a source node of a sensing pixel that is changed at falling edge of a scan control signal.
Figure 15:
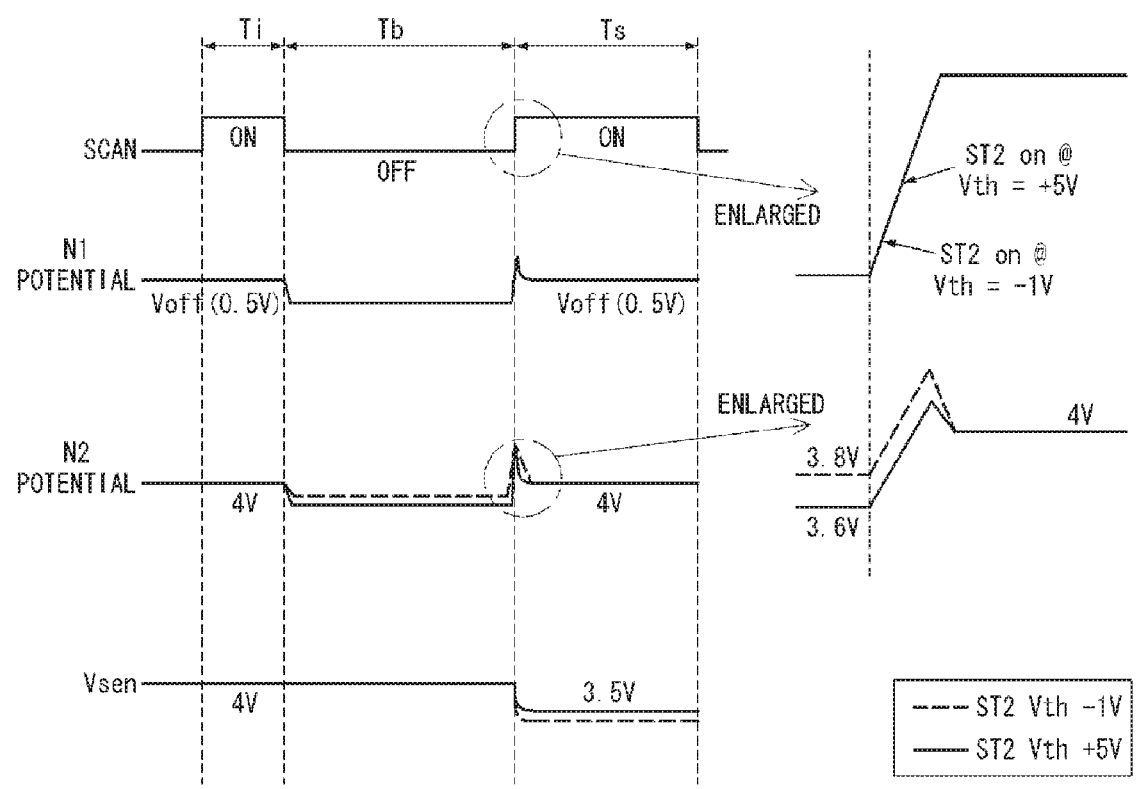
FIG. 15 is a timing diagram showing the potential of a source node of a sensing pixel that is changed at rising edge of a scan control signal.

FIGS. 14 and 15 are diagrams illustrating a case where the potential of a source node of a sensing pixel is changed at falling and rising edges of a scan control signal.

Referring to FIG. 14, a voltage of 4V is applied to the source node N2 of the driving TFT DT when the second switch TFT ST2 is turned on. The second switch TFT ST2 is turned off at a falling edge of the scan control signal SCAN, whereby the potential of the source node N2 is reduced. In this course, the greater the threshold voltage Vth of the second switch TFT ST2, the greater the degree of reduction in the potential of the source node N2. It is because the second switch TFT ST2 having a greater threshold voltage Vth is turned off relatively earlier, and therefore, the voltage of 4V may be applied relatively quickly during the time when coupling occurs.

Referring to FIG. 15, at the rising edge of the scan control signal SCAN, the potential of the source node N2 is increased greater than the initialization voltage of 4V due to the threshold voltage Vth of the second switch TFT ST2. When the second switch TFT ST2 is turned on in the sensing period Ts, a greater amount of currents flow from the source node having a relatively high potential to a sensing line. The second switch TFT ST2 is turned on quickly if a threshold voltage Vth thereof is low. Thus, the lower the threshold voltage Vth, the greater the amount of currents flowing from the source node N2 to the sensing line.

As described above, the present disclosure outputs a first sensing value by primarily sensing an OLED threshold voltage of a sensing pixel dependent upon an turn-on data voltage, and outputs a second sensing value by secondarily sensing a kickback current upon an turn-off data voltage. Then, by subtracting the second sensing value from the first sensing value, the present disclosure calculates a final sensing value from which the effect of the kickback current is removed. In doing so, the present disclosure can significantly enhance the accuracy of sensing degradation of an OLED.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An organic light emitting display comprising:
a display panel having a plurality of pixels arranged thereon, wherein each of the pixels comprises an organic light emitting diode, a switch thin film transistor and a driving thin film transistor, and the plurality of pixels are divided into multiple pixel groups, each pixel group including two or more pixels connected to different data lines and to a same gate line and a same sensing line, wherein the switch thin film transistor is coupled between the sensing line and a source electrode of the driving thin film transistor;
a gate driving circuit configured to supply a scan control signal to the gate line, wherein the switch thin film transistor is switched by the scan control signal;
a data driving circuit configured to selectively supply a turn-on data voltage and a turn-off data voltage to the data lines in sync with the scan control signal, and configured to supply the turn-on data voltage or the turn-off data voltage to a sensing pixel and solely the turn-off data voltage to a non-sensing pixel in a primary sensing period, and the turn-off data voltage to both the sensing pixel and the non-sensing pixel in a secondary sensing period;
a sensing circuit configured to output a first sensing value, acquired in the primary sensing period, based at least in part upon an organic light emitting diode threshold voltage of a sensing pixel among the two or more pixels in which the first sensing value is dependent upon the turn-on data voltage, and output a second sensing value acquired in the secondary sensing period, based at least in part upon a kickback current that is dependent upon the turn-off data voltage; and
a sensing value correction circuit configured to calculate a final sensing value for the organic light emitting diode threshold voltage based on the first sensing value and the second sensing value,
wherein each of the switch thin film transistor of the sensing pixel and the non-sensing pixel is turned on in the primary sensing period and the secondary sensing period.

2. The organic light emitting display of claim 1, wherein the sensing value correction circuit calculates the final sensing value by subtracting the second sensing value from the first sensing value.

3. The organic light emitting display of claim 1, wherein the data driving circuit is configured to:
supply the turn-on data voltage and the turn-off data voltage, alternatively, to a data line electrically coupled to the sensing pixel during a primary sensing, and continuously supply the turn-off data voltage to the data line connected to the sensing pixel during a secondary sensing; and
continuously supply the turn-off data voltage to a data line electrically coupled to a non-sensing pixel except for the sensing pixel among the two or more pixels during the primary sensing and secondary sensing, and
wherein the turn-on data voltage is a voltage applied to a gate electrode of the driving thin film transistor to turn on the driving thin film transistor, and the turn-off data voltage is a voltage applied to the gate electrode of the driving thin film transistor to turn off the driving thin film transistor.

4. The organic light emitting display of claim 1, wherein the kickback current occurs at a time when the switch thin film transistor is turned ON.

5. The organic light emitting display of claim 4, wherein the first sensing value reflects the organic light emitting diode threshold voltage of the sensing pixel, the kickback current of the sensing pixel, and the kickback current of a non-sensing pixel except for the sensing pixel among the two or more pixels, and
wherein the second sensing value reflects the kickback current of the sensing pixel, and the kickback current of the non-sensing pixel.

6. The organic light emitting display of claim 1, wherein the first sensing value and the second sensing value are obtained during any of a vertical blank period during image displaying of the organic light emitting display, a power-on sequence period before the image displaying, or a power-off sequence period after the image display.

7. A degradation sensing method of an organic light emitting display having a display panel, wherein a plurality of pixels each having an organic light emitting diode, a switch thin film transistor and a driving thin film transistor is arranged on the display panel and the plurality of pixels are divided into multiple pixel groups, each pixel group including two or more pixels connected to different data lines and to a same gate line and a same sensing line, wherein the switch thin film transistor is coupled between the sensing line and a source electrode of the driving thin film transistor, and wherein the method comprises:

supplying a scan control signal to the gate line;

selectively supplying a turn-on data voltage and a turn-off data voltage to the data lines in sync with the scan control signal;

supplying the turn-on data voltage and the turn-off data voltage to a sensing pixel and continuously supplying turn-off data voltage to a non-sensing pixel in a primary sensing period;

supplying continuously the turn-off data voltage to the sensing pixel and the non-sensing pixel in a secondary sensing period;

outputting a first sensing value, in the primary sensing period, based at least in part upon an organic light emitting diode threshold voltage of a sensing pixel among the two or more pixels, in which the first sensing value is dependent upon the turn-on data voltage, and sensing a second sensing value, in the secondary sensing period, based at least in part upon a kickback current that is dependent upon the turn-off data voltage;

calculating a final sensing value for the organic light emitting diode threshold voltage based on the first sensing value and the second sensing value; and reducing effect of the kickback current in the final sensing value.

8. The degradation sensing method of claim 7, wherein the calculating of the final sensing value comprises subtracting the second sensing value from the first sensing value.

9. The degradation sensing method of claim 7, wherein the selectively supplying of the turn-on data voltage and the turn-off data voltage to the data lines in sync with the scan control signal comprises:

supplying the turn-on data voltage and the turn-off data voltage, alternatively, to a data line electrically coupled to the sensing pixel during the primary sensing period, and continuously supplying the turn-off data voltage to the data line electrically coupled to the sensing pixel during the secondary sensing period; and continuously supplying the turn-off data voltage to a data line electrically coupled to a non-sensing pixel except for the sensing pixel among the two or more pixels, and wherein the turn-on data voltage is a voltage applied to a gate electrode of the driving thin film transistor to turn on the driving thin film transistor, and the turn-off data voltage is a voltage applied to the gate electrode of the driving thin film transistor to turn off the driving thin film transistor.

10. The degradation sensing method of claim 7, wherein the kickback current occurs at a time when the switch thin film transistor is turned ON.

11. The degradation sensing method of claim 10, wherein the first sensing value reflects the organic light emitting diode threshold voltage of the sensing pixel, the kickback current of the sensing pixel, and the kickback current of a non-sensing pixel except for the sensing pixel among the two or more pixels, and wherein the second sensing value reflects the kickback current of the sensing pixel, and the kickback current of the non-sensing pixel.

12. The degradation sensing method of claim 7, wherein the first sensing value and the second sensing value are obtained during any of a vertical blank period during image displaying of the organic light emitting display, a power-on sequence period before the image displaying, or a power-off sequence period after the image display.

* * * * *